(12) United States Patent
Tseng et al.

(10) Patent No.: US 9,429,617 B2
(45) Date of Patent: Aug. 30, 2016

(54) TESTING APPARATUS FOR LIGHT EMITTING DIODES

(75) Inventors: I-Shih Tseng, Taoyuan Hsien (TW); Tien-Teng Chang, Taoyuan Hsien (TW); Jeff Lee, Taoyuan Hsien (TW); Chih-Yu Cheng, Taoyuan Hsien (TW); Hsu-Ting Cheng, Taoyuan Hsien (TW)

(73) Assignee: CHROMA ATE INC., Taoyuan Hsien (TW)

( * ) Notice: Subject to any disclaimer, the term of this patent is extended or adjusted under 35 U.S.C. 154(b) by 1268 days.

(21) Appl. No.: 13/299,443

(22) Filed: Nov. 18, 2011

(65) Prior Publication Data

US 2013/0015859 A1    Jan. 17, 2013

(30) Foreign Application Priority Data

Jul. 14, 2011  (TW) .............................. 100124863 A

(51) Int. Cl.
  *G01R 31/26*   (2014.01)
  *G01R 1/04*    (2006.01)

(52) U.S. Cl.
  CPC ......... *G01R 31/2635* (2013.01); *G01R 1/0408* (2013.01)

(58) Field of Classification Search
  None
  See application file for complete search history.

(56) References Cited

U.S. PATENT DOCUMENTS

| | | | | |
|---|---|---|---|---|
| 4,611,116 A * | 9/1986 | Batt | ................ | G01R 31/2635 250/239 |
| 4,775,640 A * | 10/1988 | Chan | ................ | G01R 31/2603 324/754.1 |
| 5,500,540 A * | 3/1996 | Jewell | ................ | H01L 25/167 257/432 |
| 6,043,668 A * | 3/2000 | Carney | ............ | G01R 31/2886 324/750.24 |
| 6,384,612 B2 * | 5/2002 | Freund | ............ | G01J 1/04 324/754.23 |
| 6,597,195 B1 * | 7/2003 | Beaudry | ............ | G01J 1/08 324/750.05 |
| 6,925,415 B2 * | 8/2005 | Tseng | ............ | G09G 3/006 702/181 |
| 7,030,642 B2 * | 4/2006 | Butsch | ............ | G01R 1/0416 324/750.09 |
| 7,056,000 B2 * | 6/2006 | Hussey | ............ | G01R 31/2635 250/208.1 |
| 7,064,832 B2 * | 6/2006 | Rogers | ............ | G01J 1/42 250/226 |
| 7,538,359 B2 * | 5/2009 | Eng | ............ | G02B 6/0021 257/98 |

(Continued)

FOREIGN PATENT DOCUMENTS

| | | |
|---|---|---|
| JP | 2007019237 | 1/2007 |
| JP | 2007019237 A * | 1/2007 |
| JP | 2009170730 | 7/2009 |
| TW | 200603326 | 7/2004 |
| TW | 200903571 | 1/2009 |

OTHER PUBLICATIONS

JP 2007019237 A, Tago, Kazuhiro et al, Jan. 25, 2007_Machine Translation attached as a PDF.*

(Continued)

*Primary Examiner* — Jermele M Hollington
*Assistant Examiner* — Suresh K Rajaputra
(74) *Attorney, Agent, or Firm* — Locke Lord LLP; Tim Tingkang Xia, Esq.

(57) ABSTRACT

A testing apparatus for flip chip LEDs includes a transparent substrate, a spacing member, a flexible transparent carrier, and a vacuum generator. The spacing member is configured on a first surface of the transparent substrate. The flexible transparent carrier is removably assembled to the spacing member so that a closed space is formed by the flexible transparent carrier, the spacing member, and the first surface of the transparent substrate. The vacuum generator is connected to the closed space for pumping air out of the closed space, and then a part of the transparent substrate clings to the first surface to form a testing area for loading the flip chip LED.

8 Claims, 6 Drawing Sheets

(56) References Cited

U.S. PATENT DOCUMENTS

| | | | | |
|---|---|---|---|---|
| 7,804,589 B2* | 9/2010 | Tseng | ........................ | G01J 1/02 |
| | | | | 250/216 |
| 8,476,918 B2* | 7/2013 | Huang | ................ | G01R 31/2635 |
| | | | | 324/754.01 |
| 8,525,996 B2* | 9/2013 | Cheng | ........................ | G01J 3/51 |
| | | | | 356/418 |
| 8,767,198 B2* | 7/2014 | Tsai | ........................ | G01J 1/04 |
| | | | | 356/213 |
| 8,773,655 B2* | 7/2014 | Cheng | ........................ | G01J 1/42 |
| | | | | 356/213 |
| 8,952,717 B2* | 2/2015 | Ryu | ................ | G01R 31/2635 |
| | | | | 209/538 |
| 2009/0046456 A1* | 2/2009 | Urano | ........................ | F21K 9/00 |
| | | | | 362/235 |

OTHER PUBLICATIONS

Machine Translation of JP 2007019237 A.*

English translation of the abstract for JP2009170730 filed Jul. 30, 2009.

English translation of the abstract for JP2007019237 filed Jan. 25, 2007.

English translation of the abstract for TW200903571 filed Jan. 16, 2009.

English translation of the abstract for TW200603326 filed Jul. 15, 2004.

TW Office Action mailed Aug. 26, 2013 for TW Application No. 10221143260.

* cited by examiner

TESTING APPARATUS FOR LIGHT EMITTING DIODES

CROSS-REFERENCE TO RELATED APPLICATION

This application claims priority to and the benefit of Taiwan Patent Application No. 100124863 filed on Jul. 14, 2011, which is incorporated by reference in its entirety.

BACKGROUND OF THE INVENTION

1. Field of the Invention

The present invention relates to a testing apparatus for LEDs, and more particularly, to a testing apparatus which can measure flip chip LEDs and decrease the measuring errors at the same time.

2. Description of the Prior Art

Illumination system not only made positive progress in scientific and technological achievements, but also became a milestone of civilization. After the industrial revolution, humankind has begun to live in urban life due to the production intensification. Thus, the need of illumination is more necessary. There are a multitude of illumination devices well known and commonly used such as filament lamp, tubular fluorescent lamp, compact fluorescent tube, and high intensity discharge lamp. However, there is a common drawback to the illumination devices mentioned above: inefficient energy conversion. Therefore, developing more efficient illuminant is helpful to solve the energy shortage of the world.

Light emitting diode (LED) is a semiconductor light source. LEDs are used as indicator lamps in many devices and are increasingly used for other lighting. In recent years, it is expectable to improve the luminous efficiency of illumination system due to the decrease of manufacturing cost and the increase of brightness for LEDs. Further, LEDs present many advantages over incandescent light sources including lower energy consumption, longer lifetime, improved robustness, smaller size, faster switching, and greater durability and reliability. Thus, LEDs have become very popular in recent years and will become major trend in the future.

So far, there are three main classes of the LED chip: horizontal type, vertical type, and flip chip. Wherein the electrodes of the horizontal type are configured on the light-emitting layer, resulting in a decrease of the light emitting area by the electrodes, and reduce the luminous efficiency. Likewise, the vertical type has the same problem. But the flip chip is different, because the electrodes and the light-emitting layer are configured on the two opposite faces of the substrate respectively. In other words, the electrodes have no effect on the light-emitting layer, therefore, flip chip LEDs have relatively high luminous efficiency.

Before applying LED chips to practice, inspection for adequacy is necessary. During the process of testing, the wafer of the LED chips is deposited on a carrier of the testing apparatus, and the LED emits light when the probe module contacts the electrodes. Subsequently, the optical detector further converts an optical signal into an electrical signal, and the probe module can measure the electric property of LED at the same time. In general, the probe module is usually fixed, and the carrier can control the position of LED for contacting the probe module. Consequently, there is an adhesive tape or an adhesive between the carrier and the LED for making the LED immobile, avoiding the offset error of the gliding LED.

Because the electrodes and the light-emitting layer of flip chip LEDs are on the different faces, the testing apparatus of horizontal type and vertical type became inapplicable. Thus, it is necessary to design a new type of testing apparatus for flip chip LEDs. Please refer to FIG. 1A, FIG. 1A is a schematic diagram illustrating a carrier 1 of a testing apparatus for flip chip LEDs according to the prior art. As shown in FIG. 1A, the carrier 1 comprises a substrate 10 and a supporting member 12, wherein the substrate and the supporting member are made of the materials with high light transmission, and furthermore, the substrate 10 and the supporting member 12 formed a closed space. In addition, an extraction apparatus 14 can pump air out of the closed space. The supporting member 12 includes a plurality of vent holes 120, when the extraction apparatus 14 pumps air out of the closed space, it will generate negative pressure through those vent holes 120, and make a transparent carrier 16 of the supporting member 12 fixed. Wherein, a flip chip LED 2 can be fixed on the transparent carrier 16 by using the adhesive tape or other adhesives. Hence, the light emitted by the flip chip LED 2 can penetrate the transparent carrier 16, the supporting member 12, and the substrate 10, and then be detected by the optical detector.

However, as the testing apparatus mentioned above, the vent holes 120 affect the results of testing. Please refer to FIG. 1B, FIG. 1B is a schematic diagram illustrating a flip chip LED fixed on the supporting member according to the FIG. 1A. As shown in FIG. 1B, the position of the transparent carrier 16 near the vent holes 120 generate deformation resulting from the negative pressure, and further, it causes the deflection of the flip chip LED 2. Due to the deflection of the flip chip LED 2, the results of testing will be inaccurate with measuring error. Therefore, the flip chip LED 2 near the vent holes 120 must be tested again but away from the vent holes 120. At the same time, the plurality of vent holes 120 should be widely distributed on the supporting member 12 in order to maintain the transparent carrier 16 fixed on the supporting member 12. In other words, the testing apparatus for flip chip LEDs mentioned above causes over much resource consumption for further development of the flip chip LEDs.

SUMMARY OF THE INVENTION

Therefore, a scope of the invention is to provide a new type of testing apparatus which can measure flip chip LEDs and improve the problems of the prior art at the same time.

According to an embodiment of the invention, the testing apparatus for LED comprises a transparent substrate, a spacing member, a flexible transparent carrier, and a vacuum generator. The transparent substrate includes a first surface, and the spacing member is configured on a first surface of the transparent substrate. The flexible transparent carrier is removably assembled to the spacing member so that a closed space is formed by the flexible transparent carrier, the spacing member, and the first surface of the transparent substrate. The vacuum generator is connected to the closed space for pumping air out of the closed space.

In the embodiment of the invention, when the vacuum generator pumps air out of the closed space, the flexible transparent carrier generates deformation by pressure. And then the center part of the flexible transparent carrier clings to the first surface of the transparent substrate to form a testing area for loading the flip chip LED.

Many other advantages and features of the present invention will be further understood by the detailed description and the accompanying sheet of drawings.

BRIEF DESCRIPTION OF THE APPENDED DRAWINGS

To facilitate understanding, identical reference numerals have been used, where possible to designate identical elements that are common to the figures.

DETAILED DESCRIPTION OF THE INVENTION

Figure 1A:
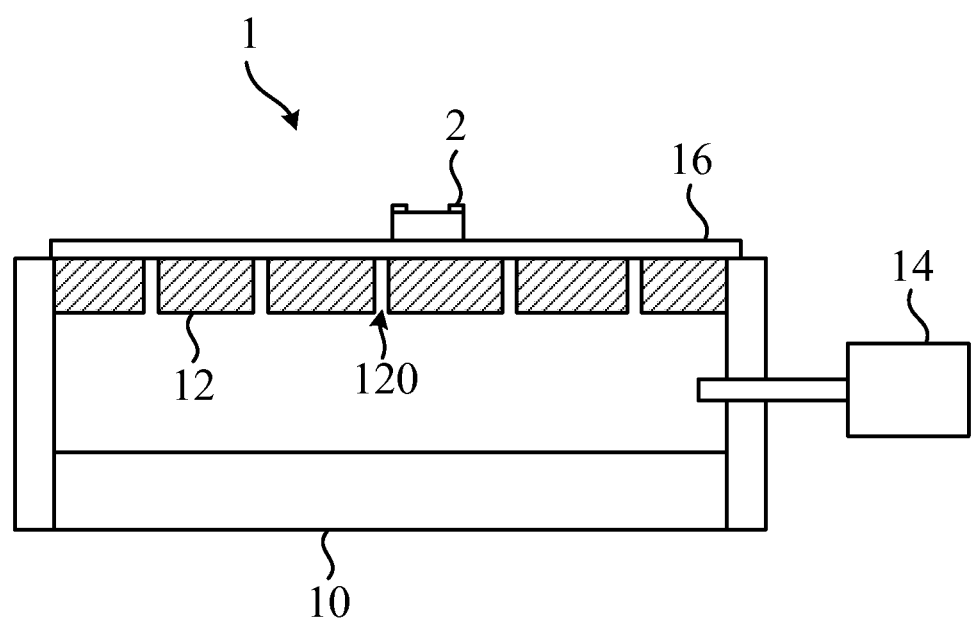
FIG. 1A is a schematic diagram illustrating a carrier of a testing apparatus for flip chip LEDs according to the prior art.
Figure 1B:
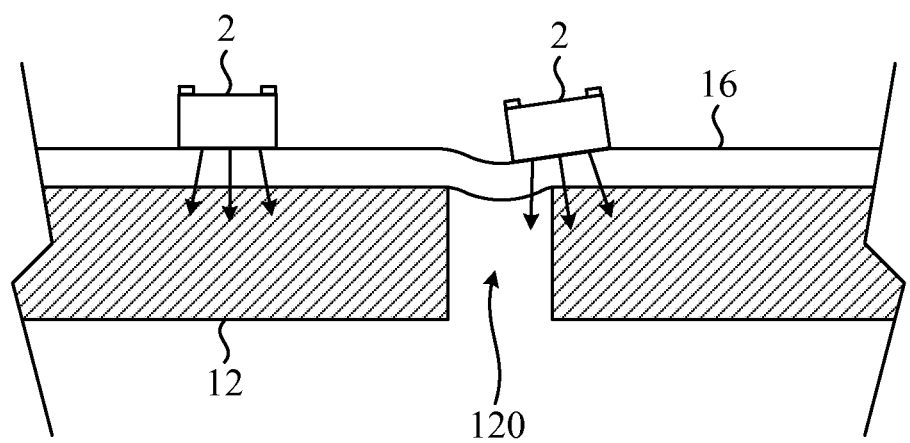
FIG. 1B is a schematic diagram illustrating a flip chip LED fixed on the supporting member according to the FIG. 1A.
Figure 2:
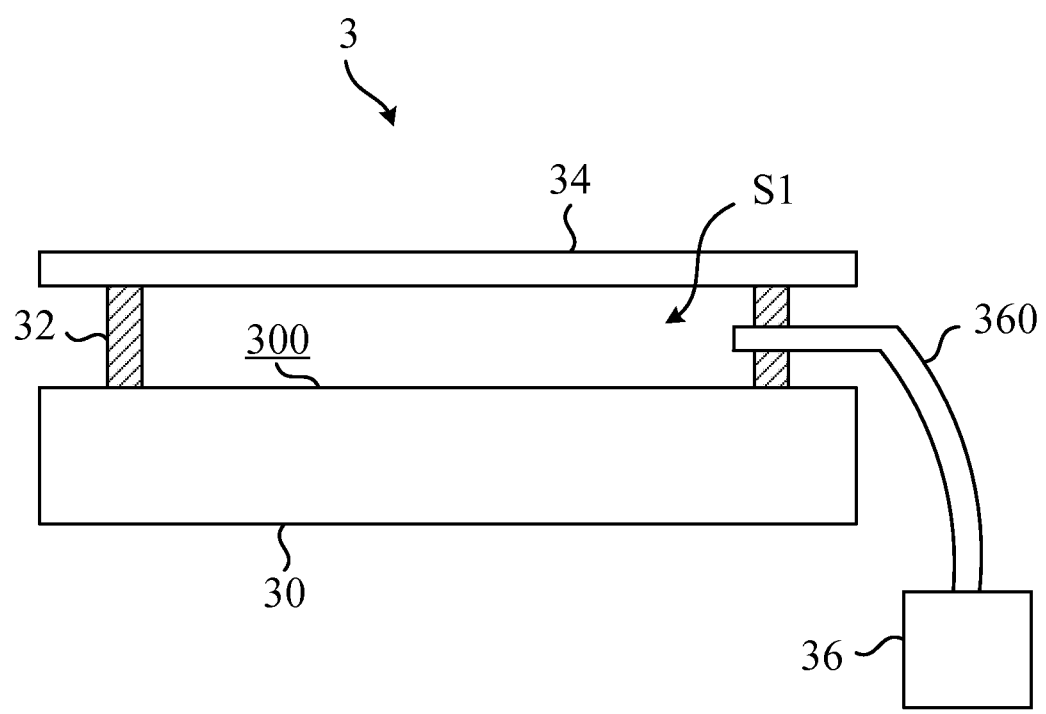
FIG. 2 is a sectional view illustrating an embodiment of a testing apparatus for LEDs according to the invention.

The invention discloses a new type of testing apparatus. More particularly, the invention discloses a testing apparatus which can measure flip chip LEDs and improve the problems of the prior art at the same time. Please refer to FIG. 2. FIG. 2 is a sectional view illustrating an embodiment of a testing apparatus for LEDs 3 according to the invention. As shown in FIG. 2, the testing apparatus for LEDs 3 comprises a transparent substrate 30, a spacing member 32, a flexible transparent carrier 34, and a vacuum generator 36. In practice, the transparent substrate can be a glass substrate with high light transmission.

In the embodiment, a spacing member 32 is configured on a first surface 300 of a transparent substrate 30, and enclosing an area on the first surface 300. The flexible transparent carrier 34 is removably assembled to the spacing member 32. It can apply force on the connection between the flexible transparent carrier 34 and the spacing member 32 for forming a close contact. For example, when a force toward the spacing member 32 is applied on the connection of the flexible transparent carrier 34 and the spacing member 32, a close contact will be formed by squeeze. Therefore, the flexible transparent carrier 34 has a close contact with the spacing member 32, and the spacing member 32 can be sealed on the area of the first surface 300, so a closed space S1 is formed by the flexible transparent carrier 34, the spacing member 32, and the first surface 300.

A vacuum generator 36 having an air passage 360 across the spacing member 32 is connected to the closed space S1 for pumping air out of the closed space S1. Due to the closed space S1 is sealed, a negative pressure can be generated when air is pumped out of the closed space S1. Additionally, the flexible transparent carrier 34 with pliability generates deformation by pressure and dented toward the closed space S1.

Figure 3:
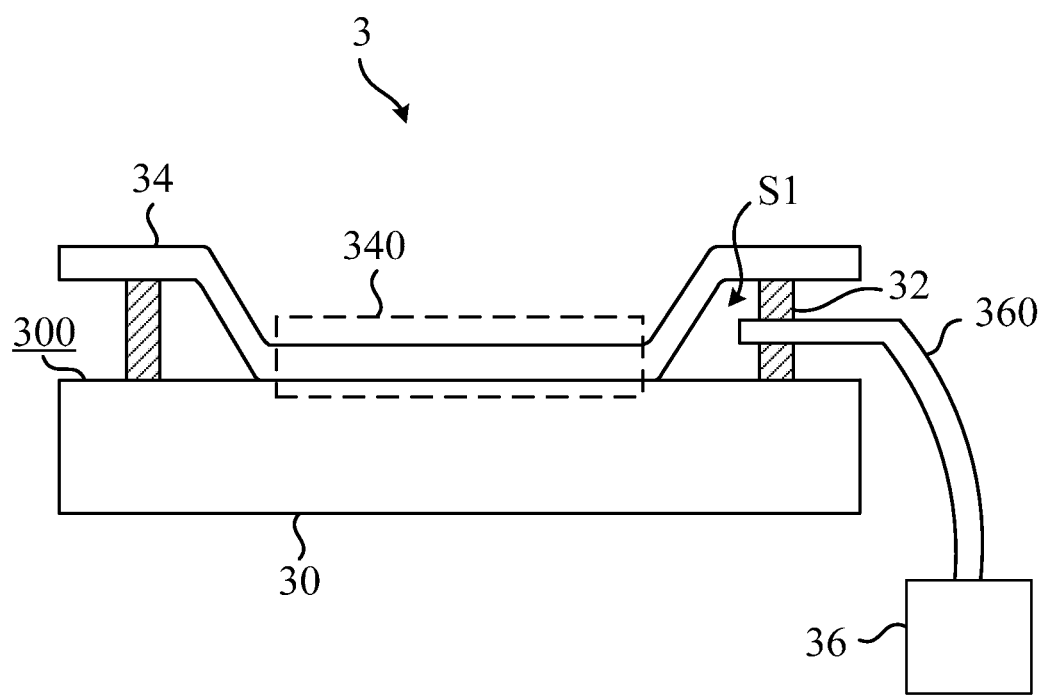
FIG. 3 is a sectional view illustrating a vacuum generator pumping air out of the closed space of a testing apparatus for LEDs according to the FIG. 2.

Please refer to FIG. 3. FIG. 3 is a sectional view illustrating a vacuum generator 36 pumping air out of the closed space S1 of a testing apparatus for LEDs 3. As shown in FIG. 3, when the vacuum generator 36 pumps air out of the closed space S1, the center part of the flexible transparent carrier 34 is dented and clings to the closed space S1 forming a testing area 340. The testing area 340 can be used in loading LEDs, more particularly for loading the flip chip LED. In practice, the flip chip LEDs can be fixed on the testing area by the scotch tape or the transparent gel. For clarity, the scotch tape or the transparent gel is not shown in FIG. 3

In practical application, the deformation of the flexible transparent carrier should be tested first, thus the testing area can be defined. During the process of testing for flip chip LEDs, the wafer of the LED chips is fixed on the testing area by the scotch tape or the transparent gel firstly, and then the vacuum generator pumps air out of the closed space until the testing area has clung to the transparent substrate. Subsequently, keep the negative pressure steadily for testing.

Figure 4:
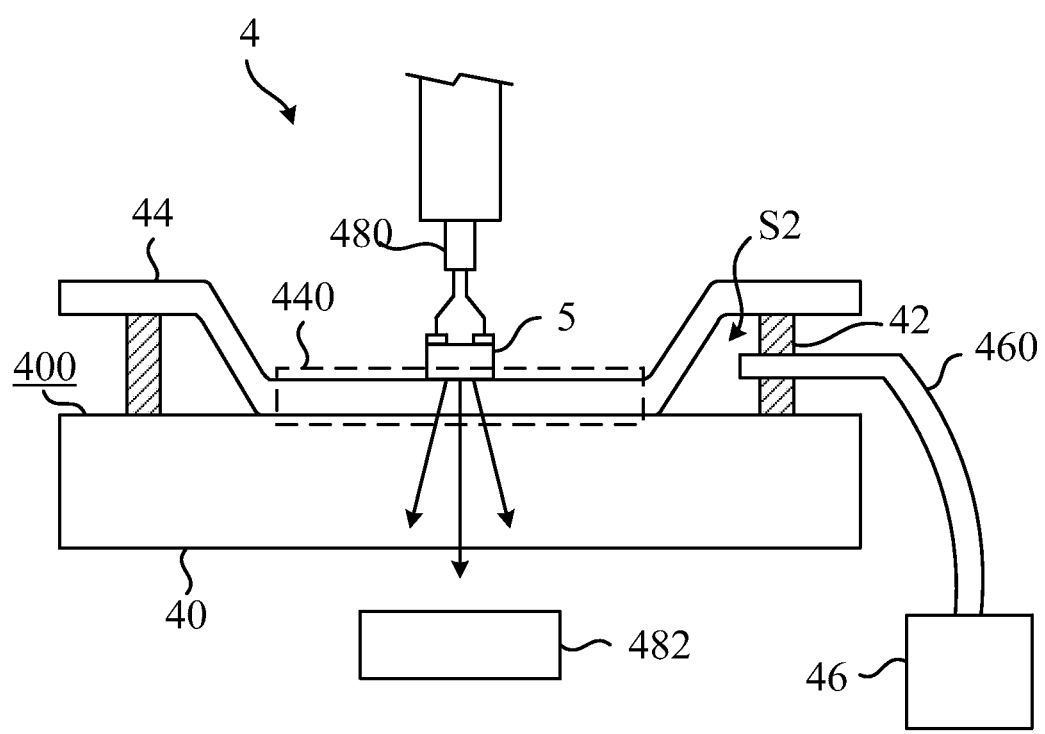
FIG. 4 is a sectional view illustrating another embodiment of a testing apparatus for measuring flip chip LEDs according to the invention.

Please refer to FIG. 4. FIG. 4 is a sectional view illustrating another embodiment of a testing apparatus for LEDs 4 applied to a flip chip LED 5 according to the invention. As shown in FIG. 4, a testing apparatus for LEDs 4 comprises a transparent substrate 40, a spacing member 42, a flexible transparent carrier 44, a vacuum generator 46, a probe module 480, and an optical detector 482. Wherein, the transparent substrate 40, the spacing member 42, the flexible transparent carrier 44, and the vacuum generator 46 correspond to the components of the embodiment mentioned previously, thus the components needn't be elaborate any further.

In the embodiment, the probe module 480 is configured on one side of the flexible transparent carrier 44 for contacting a P-N junction of the flip chip LED 5 loaded on the testing area. And the probe module 480 can provide a testing power for the P-N junction of the flip chip LED 5. When the flip chip LED 5 is provided a testing power, the light is emitted from the light-emitting layer, and penetrates the flexible transparent carrier 44 and the transparent substrate 40. Then, the light can be detected by the optical detector 482 configured on one side of the transparent substrate 40.

Additionally, the flip chip LED 5 is configured on the testing area 440 of the flexible transparent carrier 44, and the testing area 440 clings to a first surface 400 of the transparent substrate 40 when the vacuum generator 46 pumps air out of the closed space S2. Therefore, the light can emit directly from the light-emitting layer of the flip chip LED 5 without obstruction, and avoid generating the refraction or the total reflection at the same time. Compared to the prior art, the embodiment of the testing apparatus for LEDs do not let the results of testing inaccurate by those the vent holes.

In practice, the components of the embodiments mentioned previously can be linked to a process control system. The process control system can control the vacuum generator and the transparent substrate. With that the probe module can contact a P-N junction of flip chip LED for providing the testing power for flip chip LEDs, and measure the electric property of flip chip LEDs at the same time. Additionally, the luminous property of flip chip LEDs can be measured by the optical detector.

In the embodiments mentioned previously, the shape and the size of the flexible transparent carrier or the spacing member can be adjusted according to practical need. For example, to make the wafer to be deposited on the testing area completely, the flexible transparent carrier and the spacing member with different size should be designed for different wafers of LED. Furthermore, the flexible transparent carrier and the spacing member with different shape can be designed according to the shape of the testing area.

Figure 5:
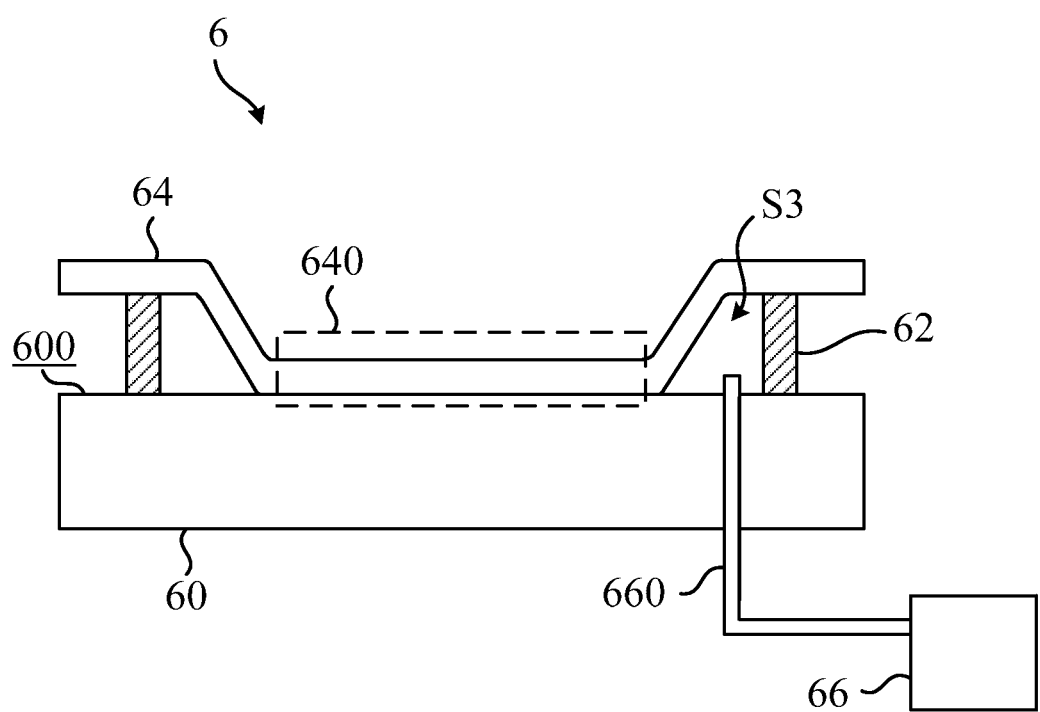
FIG. 5 is a sectional view illustrating another embodiment of a testing apparatus for LEDs according to the invention.

Please refer to FIG. 5. FIG. 5 is a sectional view illustrating another embodiment of a testing apparatus for LEDs 6 according to the invention. As shown in FIG. 5, a testing apparatus for LEDs 6 comprises a transparent substrate 60, a spacing member 62, a flexible transparent carrier 64, and a vacuum generator 66. Unlike the embodiments mentioned previously, an air passage 660 of the vacuum generator 66 for pumping air out of the closed space S3 is across the transparent substrate 60 and connected to the closed space S3 in this embodiment. To be noticed, the components of the embodiments mentioned previously and this embodiment are substantially the same, so the components needn't be elaborate any further.

In the embodiment, the center part of the flexible transparent carrier 64 should be clung to the first surface 600 of the transparent substrate 60 due to the negative pressure which is generated from the closed space S3. For purpose of keeping the negative pressure of the closed space S3 steadily and avoiding a testing area 640 being uneven, the opening of the air passage 660 can be configured near the spacing member 62, as shown in FIG. 5.

According to the above, the invention is to provide a testing apparatus for flip chip LEDs, and its vacuum suction system is utilized to make the flexible transparent carrier to be clung to the transparent substrate. Compared to the prior art, the invention can prevent an inaccurate results of testing. In other words, the invention can inspect the luminous property of flip chip LEDs more efficiently, and reduce the resource consumption.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A testing apparatus for a flip chip LED, comprising:
   a transparent substrate having a first surface;
   a spacing member configured on the first surface of the transparent substrate;
   a flexible transparent carrier removably assembled to the spacing member for forming a closed space by the flexible transparent carrier, the spacing member, and the first surface of the transparent substrate; and
   a vacuum generator connected to the closed space for pumping air out of the closed space;
   wherein when the transparent substrate is assembled to the spacing member and the vacuum generator pumps air out of the closed space, a part of the flexible transparent carrier clings to the first surface of the transparent substrate to form a testing area for loading the flip chip LED, and there is no opening on a part of the first surface of the transparent substrate where the testing area is located.

2. The testing apparatus of claim 1, further comprising an optical detector for receiving the ray through the transparent substrate.

3. The testing apparatus of claim 2, further comprising a probe module for contacting a P-N junction of the flip chip LED loaded on the testing area and providing a testing power for the P-N junction.

4. The testing apparatus of claim 3, wherein when the probe module contacts a P-N junction of the flip chip LED loaded on the testing area and provides the testing power for the P-N junction, the flip chip LED emits light through the testing area of the flexible transparent carrier and the transparent substrate corresponding to the testing power.

5. The testing apparatus of claim 1, wherein the transparent substrate is a glass substrate.

6. The testing apparatus of claim 1, wherein the vacuum generator further comprises an air passage for pumping air out of the closed space, and the air passage is connected to the closed space through the spacing member.

7. The testing apparatus of claim 1, wherein the vacuum generator further comprises an air passage for pumping air out of the closed space, and the air passage is connected to the closed space through the transparent substrate.

8. The testing apparatus of claim 1, wherein the part of the flexible transparent carrier is spaced apart from the first surface of the transparent substrate when the vacuum generator does not pump air out of the closed space, and the part of the flexible transparent carrier is moved to the transparent substrate due to negative pressure so as to cling to the first surface when the vacuum generator pumps air out of the closed space.

* * * * *